(12) United States Patent
Outaleb et al.

(10) Patent No.: US 8,314,654 B2
(45) Date of Patent: Nov. 20, 2012

(54) MULTI-BAND HIGH-EFFICIENCY DOHERTY AMPLIFIER

(75) Inventors: Noureddine Outaleb, Ottawa (CA); Igor Acimovic, Gatineau (CA)

(73) Assignee: Alcatel Lucent, Paris (FR)

( * ) Notice: Subject to any disclaimer, the term of this patent is extended or adjusted under 35 U.S.C. 154(b) by 23 days.

(21) Appl. No.: 12/801,014

(22) Filed: May 17, 2010

(65) Prior Publication Data

US 2011/0279178 A1    Nov. 17, 2011

(51) Int. Cl.
*H03F 3/68* (2006.01)
(52) U.S. Cl. .................................. 330/124 R; 330/295
(58) Field of Classification Search .............. 330/124 R, 330/295
See application file for complete search history.

(56) References Cited

U.S. PATENT DOCUMENTS

| | | | |
|---|---|---|---|
| 3,961,286 A * | 6/1976 | Kim | 332/144 |
| 5,606,283 A * | 2/1997 | Allen et al. | 330/124 R |
| 6,433,649 B2 * | 8/2002 | Miura et al. | 333/1.1 |
| 7,061,314 B2 * | 6/2006 | Kwon et al. | 330/124 R |
| 2006/0246855 A1 | 11/2006 | Kato et al. | |
| 2007/0008032 A1 | 1/2007 | Kyu et al. | |
| 2011/0193624 A1 * | 8/2011 | Scott et al. | 330/124 R |

FOREIGN PATENT DOCUMENTS

EP    2159912    3/2010

OTHER PUBLICATIONS

Sarkeshi, Medhi, et al. "A Novel Doherty Amplifier for Enhanced Load Modulation and Higher Bandwitdth." Microwave Symposium Digest, 2008 IEEE, MTT-S International, IEEE, Piscataway, New Jersey, USA, Jun. 15, 2008, pp. 763-766.
Djoumessi, Erik Emmanuel, et al. "Varactor-Tuned Dual-Band Quadrature Hybrid Coupler." IEEE Microwave and Wireless Components Letters, IEEE Service Center, New York, New York, USA, vol. 16, No. 11, Nov. 1, 2006, pp. 603-605.
Medina, M.A. Yarleque, et al. "Doherty amplifier design for 3.5 GHz WiMAX considering load line and loop stability." Microwave Integrated Circuit Conference, 2008. Eumic 2008. European, IEEE, Piscataway, New Jersey, USA, Oct. 27, 2008, pp. 522-525.
International Search Report mailed Nov. 10, 2011, in International Patent Application No. PCT/IB2011/001451.

* cited by examiner

*Primary Examiner* — Robert Pascal
*Assistant Examiner* — Khiem Nguyen
(74) *Attorney, Agent, or Firm* — Harness, Dickey & Pierce (57) ABSTRACT

The present invention relates to a Multi-Band Doherty amplifier. Embodiments of the present invention provide an amplifying structure including a main amplifier configured to amplify a first signal, a peak amplifier configured to amplify a second signal, a tunable impedance inverter configured to perform impedance inversion to modulate a load impedance of the main amplifier, and a combining node configured to receive the amplified second signal from the peak amplifier and an output of the tunable impedance inverter. The tunable impedance inverter includes a tuner configured to tune the impedance inversion over at least one broad frequency band. The tuner is (i) at least one capacitor, (i) at least one varactor, or (ii) at least one open stub shunted by a diode.

21 Claims, 4 Drawing Sheets

MULTI-BAND HIGH-EFFICIENCY DOHERTY AMPLIFIER

BACKGROUND

Wireless communication standards are continuously changing in order to adapt to the high volume data transfer required today between consumers. As a result, operators of wireless communication systems struggle with extra costs that result from upgrading the wireless system or the complete replacement of the already deployed sites. Also, the continuously changing of wireless communication standards disturbs base station vendors in their product strategy and portfolio. Multi-Standard or Multi-Band Radio Base Station is a solution that may reduce the deployment cost for the operators as well as the production cost for the network infrastructure component vendors. Particularly, a transceiver power amplifier is one of the most critical components in a wireless base station. Today's Power Amplifier is not only required to be highly efficient in order to keep the base station Operating Expense (OPEX) low but must be also broadband enough to operate in a Multi-band system.

Because of its simplicity, the Doherty Power Amplifier (PA) is the most efficient architecture that is used today to efficiently transmit high peak to average ratio modulated signals. However, the Doherty PA is inherently narrowband and its performance is significantly reduced when used in a multi-band transceiver. In fact, the radio frequency bandwidth (BW) of the Doherty PA is not only limited by the individual stage BW (Main stage and Peak stage) and the output quarter-line combiner, but also the BW of the Doherty PA is limited by the inherent phase linearity of the transmission lines that constitute the matching networks and/or the offset lines used at the output of the main and peak stages.

For example, the conventional Doherty amplifier uses two amplifier stages, the main amplifier and the peak amplifier, with their outputs interconnected by a quarter wavelength impedance inverter. The Doherty amplifier maintains its maximum efficiency at power back-off with the help of the peak amplifier and the quarter-wavelength transformer. At power back-off, the peak amplifier is intentionally kept OFF to allow the saturation of the main amplifier by doubling its load impedance through the impedance transformer. The BW of the Doherty amplifier is related to the BW of the individual stages and to the output quarter wavelength transformer BW. Also, at average operating power, the Doherty BW is narrower than expected even with using broadband main and peaking stages. This is due to the fact that the matching network transmission line phase and/or the offset lines phase are inherently linear over frequency, which inherently limits the BW of the Doherty Amplifier.

This significantly degrades the efficiency and the power at the frequency band edges. The same applies for the Peaking OFF impedance, which is real and high at only one frequency (good isolation only at mid-band). Hence, this drawback limits the Doherty high efficiency operating BW to a max of 5-7%. The effect of the output quarter wavelength inverter on the BW starts to be significant for BW higher than 10%. To be able to be used in a multi-standard transceiver, the Doherty power amplifier is required to be tunable over the whole frequency bands of interest.

SUMMARY

The present invention relates to a Multi-Band Doherty amplifier. Embodiments of the present invention provide an amplifying structure including a main amplifier configured to amplify a first signal, a peak amplifier configured to amplify a second signal, a tunable impedance inverter configured to perform impedance inversion to modulate a load impedance of the main amplifier, and a combining node configured to receive the amplified second signal from the peak amplifier and an output of the tunable impedance inverter. The tunable impedance inverter includes a tuner configured to tune the impedance inversion over at least one broad frequency band. The tuner is (i) at least one capacitor, (i) at least one varactor, or (ii) at least one open stub shunted by a diode.

The amplifying structure further includes power splitter configured to receive an input signal having the at least one frequency band and split the input signal into the first signal and the second signal.

The tunable impedance inverter may further include a circulator connected to the tuner configured to split the amplified first signal into incident signals and reflected signals, where the tuner adjusts a phase of the reflected signals for destructive combining at an input of the tunable impedance inverter. Alternatively, the tunable impedance inverter includes a first hybrid coupler connected to the tuner. The amplifying structure may further include a controller configured to control the tunable impedance inverter by adjusting values of the tuner.

According to another embodiment of the present invention, the amplifying structure includes a main amplifier configured to amplify a first signal, a peak amplifier configured to amplify a second signal, a tunable impedance inverter configured to perform impedance inversion to modulate a load impedance of the main amplifier, where the tunable impedance inverter includes a circulator configured to split the amplified first signal into incident signals and reflected signals and a tuner configured to adjust a phase of the reflected signals at an input of the impedance inverter. The structure also includes a combining node configured to receive the amplified second signal from the peak amplifier and an output of the tunable impedance inverter. The tuner is a capacitor, varactor, or an open stub shunted by a diode.

The circulator includes a first port connected to an output terminal of the main amplifier, a second port connected to the combining node, and a third port connected to the tuner. The amplifying structure may further include a controller configured to control the tunable impedance inverter by adjusting values of the tuner.

In another embodiment of the present invention, the amplifying structure includes a main amplifier configured to amplify a first signal, a peak amplifier configured to amplify a second signal, a tunable impedance inverter configured to perform impedance inversion to modulate a load impedance of the main amplifier, where the tunable impedance inverter includes a first hybrid coupler and a tuner, the tuner being configured to tune the impedance inversion over at least one broad frequency band, and a combining node configured to receive the amplified second signal from the peak amplifier and an output of the first hybrid coupler. The tuner includes two tuning elements and each of the two tuning elements is connected to a respective output, port of the first hybrid coupler. The two tuning elements are (i) capacitors, (ii) varactors, or (iii) open stubs shunted by diodes.

The amplifying structure further includes a controller configured to control the tunable impedance inverter by adjusting values of the tuner. Also, the amplifying structure further includes a first offset line and a second offset line. The first offset line and the second offset line provides connectivity between the first hybrid coupler and the main amplifier, if selected. The first offset line has a length tuned for a first frequency band and the second offset line has a length tuned for a second frequency band.

One of the first offset line and the second offset line is selected based on manually moving a DC block capacitor of the main amplifier. Alternatively, a first selector is configured to select between the first offset line and the second offset line.

The amplifying structure further includes a third offset line and a fourth offset line. The third offset line and the fourth offset line provides connectivity between the first hybrid coupler and the peak amplifier, if selected. The third offset line has a length tuned for the first frequency band and the fourth offset line has a length tuned for the second frequency band.

One of the third offset line and the fourth offset line is selected based on manually moving a DC block capacitor of the peak amplifier. Alternatively, a second selector is configured to select between the third offset line and the fourth offset line.

The amplifying structure may further include a second hybrid coupler connected between the main amplifier and the first hybrid coupler, and a third hybrid coupler connected between the combining node and the peak amplifier. The output ports of the first and second hybrid couplers are connected to tuning elements. The tuning elements of the second and third hybrid couplers are (i) capacitors, (ii) varactors, or (iii) open stubs shunted by diodes.

In another embodiment of the present invention, a Doherty amplifier includes a tunable impedance inverter configured to tune impedance inversion to a center frequency of a signal for amplification, and a controller configured to control the tunable impedance inverter.

BRIEF DESCRIPTION OF THE DRAWINGS

Example embodiments will become more fully understood from the detailed description given herein below and the accompanying drawings, wherein like elements are represented by like reference numerals, which are given by way of illustration only and thus are not limiting of the present invention, and wherein.

DETAILED DESCRIPTION OF EXAMPLE EMBODIMENTS

Various embodiments of the present invention will now be described more fully with reference to the accompanying drawings. Like elements on the drawings are labeled by like reference numerals.

As used herein, the singular forms "a", "an", and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

The present invention will now be described with reference to the attached figures. Various structures, systems and devices are schematically depicted in the drawings for purposes of explanation only and so as not to obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. To the extent that a term or phrase is intended to have a special meaning, i.e., a meaning other than that understood by skilled artisans, such a special definition will be expressly set forth in the specification that directly and unequivocally provides the special definition for the term or phrase.

Embodiments of the present invention overcome the deficiencies of the conventional Doherty amplifiers when used in broadband applications by providing a tunable impedance inverter. The tunable impedance inverters of the present invention are configured to perform impedance inversion to modulate a load impedance of the main amplifier. The tunable impedance inverter includes a tuner configured to dynamically tune the impedance inversion over at least one broad frequency band. For instance, the tunable impedance inverter tunes the impedance inversion to a center frequency of a signal for amplification. The tunable aspect of the impedance inverter may be controlled by a controller to allow for dynamic adjustments dependent on a frequency of an input signal, which may range over of a broadband signal and/or multiband signal.

The Doherty amplifiers of the present invention may be embodied in a base station in a wireless communication system that provides wireless connectivity to a number of end uses. The Doherty amplifiers may amplify signals to be transmitted to the end uses. Further, the Doherty amplifiers of the present invention may be embodied in other types of devices such as W-CDMA, UMTS, LTE or WiMAX base stations, base transceiver stations, base station routers, WiFi access points, or any other device that provides the radio baseband functions for data and/or voice connectivity between a network and one or more end users. The end users may include but are not limited to end user (EU) equipment, fixed or mobile subscriber units, receivers, cellular telephones, personal digital assistants (PDA), personal computers, or any other type of user device capable of operating in a wireless environment.

The Doherty amplifiers of the present invention include a tunable circulator-based impedance inverter or a tunable hybrid coupler operating as an impedance inverter that includes tuning elements. These embodiments are discussed with reference to FIGS. 1-4 of the present application.

Figure 1:
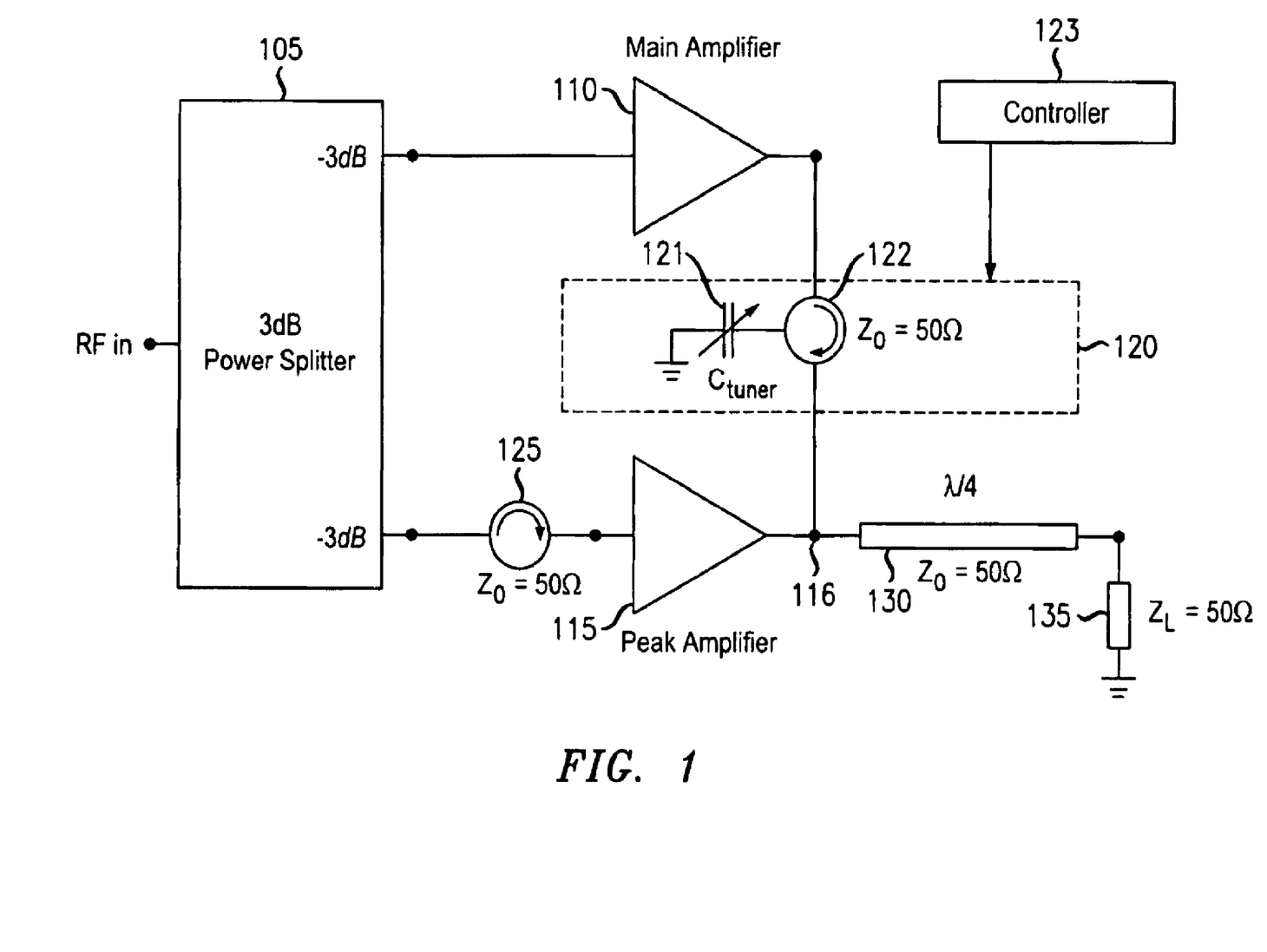
FIG. 1 illustrates a Doherty amplifier structure according to an embodiment of the present invention.

FIG. 1 illustrates a Doherty amplifier structure according to an embodiment of the present application. The Doherty amplifier structure includes a power splitter 105 configured to split an input signal into a first signal and a second signal, a main amplifier 110 for amplifying the first signal, a peak amplifier 115 for selectively amplifying the second signal, a phase compensator 125 for shifting a phase of the second signal, a tunable impedance inverter 120 configured to perform impedance inversion, a quarter-wavelength transformer 130 for combining the output of the main amplifier 110 and the peak amplifier 115, and a load impedance 135.

The power splitter 105 may be a 3 dB power splitter, for example, and includes at least three ports. The 3 dB power splitter generally divides the input signal into first and second signals having equal amplitudes. In addition, other types of power splitters apart from the 3 dB power splitter may be used within the Doherty amplifier of FIG. 1. A first port of the power splitter 105 receives an input signal. The input signal maybe a radio-frequency (RF) signal having a frequency over a broad frequency band (e.g., 860-960 MHz). A second port of the power splitter 105 is connected to an input of the main amplifier 110, and a third port of the power splitter 105 is connected to an input of the peak amplifier 115 via the phase compensator 125. The phase compensator 125 is connected between the third port of the power splitter 105 and the input of the peak amplifier 115 in order to compensate for the phase change introduced by the tunable impedance inverter 120. The phase compensator 125 may be a circulator.

After the input signal is split into the first and second signals and the second signal passes through the phase compensator 125, the first and second signals are then amplified, respectively, by the main amplifier 110, or the combination of the main amplifier 110 and the peak amplifier 115, as discussed below.

For instance, the peak amplifier 115 is selectively operable to operate at selected times in combination with the main amplifier 110. That is, the peak amplifier 115 may be kept off until power requirements call for a higher power output from the main amplifier 110, at which time the peak amplifier 115 is turned on and operates to increase the power output of the main amplifier 110. In other words, the peak amplifier 115 amplifies the second signal if the signal strength of the second signal is above a threshold level. The term "selectively operable" indicates the amplifier operational state changes in response to the input signal. Otherwise, if the signal strength of the second signal is below the threshold level, the peak amplifier 115 is turned OFF (e.g., open circuit), and only the main amplifier 110 operates to amplify the first signal. Once the signal strength of the second signal increases above the threshold level, the peak amplifier 115 is turned on, and the load impedance for the main amplifier 110 gradually decreases to the designed level.

The output of the main amplifier 110 and the peak amplifier 115 are connected at a combining node 116 via the tunable impedance inverter 120. If the peak amplifier 115 and the main amplifier 110 are operating, the combining node 116 receives the amplified second signal from the peak amplifier 115 and the output of the tunable impedance inverter 120. If only the main amplifier 110 is operating (as discussed above), the combining node 116 receives the signal from the output of the tunable impedance inverter 120.

The tunable impedance inverter 120 receives the amplified first signal from the main amplifier 110 and performs impedance inversion to modulate a load impedance of the main amplifier 110. Impedance inversion in quarter-wavelength transformers (e.g., conventional Doherty amplifiers) is accomplished by the destructive combining of reflected signals on the input side of the quarter-wavelength transformer and constructive combining of transmitted signals on the output side of the quarter-wavelength transformer. However, for signals that deviate from the center frequency that the conventional Doherty amplifier was designed for, the destructive and constructive combining becomes less perfect, and the impedance inversion properties of the transformer degrade (thus limiting the bandwidth of operation). Furthermore, changing either impedance or the length of the transformer cannot be accomplished dynamically.

In contrast, embodiments of the present invention provide a tunable impedance inverter to tune the impedance inversion over a broad frequency range. In one embodiment, as shown in FIG. 1, the tunable impedance inverter 120 includes a circulator 122 and a tuner which uses capacitors as the tuner 121. The tuner 121 may include any type of capacitors including but not limited to fixed capacitors and variable capacitors such as a digital capacitors, for example. In addition, varactors (diode) may be used in place of the fixed or variable capacitors. Values of the capacitors tune the tunable impedance inverter 120 in a targeted operating bandwidth. The values of the tuner 121 may be selected manually for every frequency band of operation. In addition, variable capacitors (e.g., a digital capacitors) may be used as the tuning elements 121 in order to dynamically tune the tunable impedance inverter 120 by varying the capacitor bias.

The circulator 122 provides separate paths for incident and reflected waves of the first signal, which allows for phase adjustment of reflected waves to be independent to that of the incident waves. Incident waves are propagating from the output of the main amplifier 110 (source) towards the load impedance. On the other hand, the reflected waves are propagating from the load impedance towards to the output of the main amplifier 110. In a quarter-wavelength transformer, the incident and the reflected waves bounce between the two interfaces and both the incident and reflected waves share the same propagation path and thus undergo the same phase shift.

The circulator 122 includes at least three ports. The first port of the circulator 122 is connected to the output of the main amplifier 110, the second port is connected to the combining node 116, and the third port is connected to the tuning element 121. The proper alignment of the reflections at the input side of the tunable impedance inverter 120 provide for correct operation of the Doherty amplifier of FIG. 1. This is accomplished by the capacitor-based tuner 121 that terminates the third port of the circulator 122. The values of the capacitors within the tuner 121 set the phase of the reflected waves which sets the frequency at which the impedance inversion is performed. In the case of using fixed capacitors within the tuner 121, a fixed capacitor values for every frequency band of operation will allow a static tuning of the impedance inverter. In the case of using variable capacitors such the digital capacitors as the tuner 121, the digital capacitors allows a dynamic tuning of the impedance inversion. Because the third port of the circulator 122 is terminated with a tuner 121 consisting of fixed value capacitors or variable capacitors, the Doherty amplifier of FIG. 1 respectively allows for static or dynamic phase tuning of the reflected waves in order to achieve destructive combining of the reflected waves at the input side of the tunable impedance inverter 120, and thus obtain proper impedance inversion at the frequency band of interest. This impedance inversion operation can be performed over the entire frequency bandwidth of the circulator 122.

In the case of using a fixed capacitor values as the tuner 121, the optimum capacitor values that correspond to the target operating frequency band are added manually in the Power Amplifier board. In the case of using variable capacitors as the tuner 121, the optimum capacitor values may be dynamically adjusted by the controller 123. For instance, the controller 123 is configured to control the variable capacitors in the tuner 121 by adjusting capacitor values in order to allow for dynamic phase tuning of the reflected waves. The controller 123 includes a processor and memory, where the memory stores frequencies that map to different capacitance values. The controller 123 transmits control signals to the variable capacitors and sets the optimum capacitor values suitable for the center frequency of the frequency band of interest.

The signal from the output of the tunable impedance inverter 120 and the amplified second signal from the peak amplifier 115 are combined via the quarter-wavelength transformer 130, and the combination is supplied to the load impedance 135.

Figure 2:
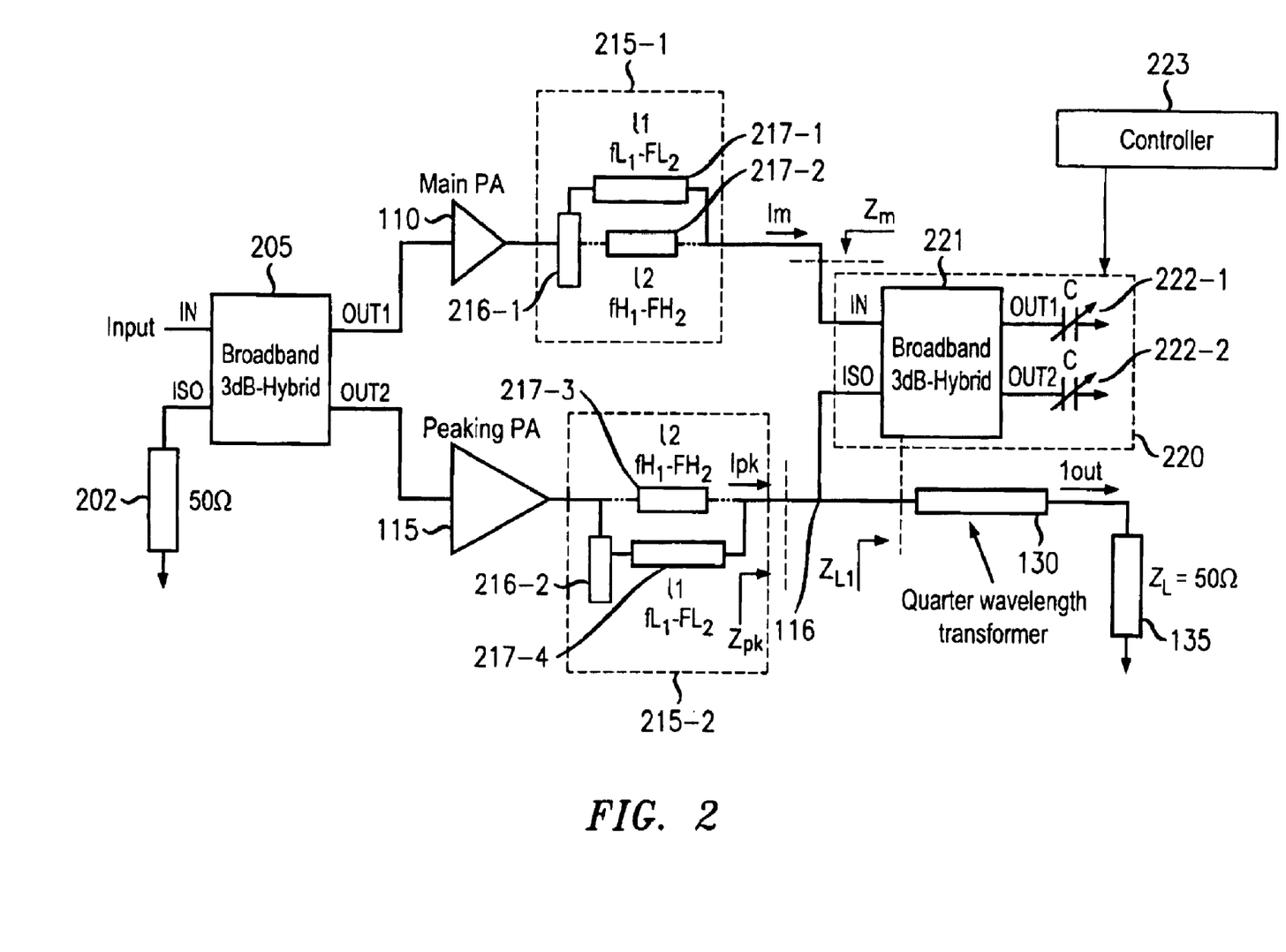
FIG. 2 illustrates a Doherty amplifier structure according to another embodiment of the present invention.

FIG. 2 illustrates a Doherty amplifier structure according to another embodiment of the present invention. Similar to the Doherty amplifier structure of FIG. 1, the Doherty amplifier structure of FIG. 2 includes the main amplifier 110 for amplifying the first signal, the peak amplifier 115 for amplifying the second signal, the quarter-wavelength transformer 130 for transforming the combining node impedance (e.g., 25Ω) to the load impedance 135 of 50Ω. These components operate in a similar manner as discussed above.

However, the Doherty amplifier structure of FIG. 2 uses a hybrid coupler 205 as a power splitter for splitting the input signal into the first signal and the second signal. Among other types of hybrid couplers, the hybrid coupler 205 may be a broadband 3 dB hybrid coupler, for example. The hybrid coupler 205 includes four ports. An input port of the hybrid coupler 205 receives the input signal, an isolation port is coupled to a load 202 (e.g., 50Ω), a first output port is connected to the input of the main amplifier 110, and a second output port is connected to the input of the peaking amplifier 115.

Similar to the Doherty amplifier structure of FIG. 1, the main amplifier 110 amplifies the first signal and the peak amplifier amplifies the second signal. In this embodiment, a hybrid coupler 221 operates as the tunable impedance inverter 220 to modulate the load of the main amplifier 110, which is discussed later in the specification.

The output of the main amplifier 110 is connected to an input port of the tunable impedance inverter 220 via a first offset line circuit 215-1, and the output of the peak amplifier 115 is connected to an isolation port of the tunable impedance inverter 220 via a second offset line circuit 215-2. The first offset line circuit 215-1 and the second offset line circuit 215-2 allows the Doherty amplifier circuit of FIG. 2 to handle a wider bandwidth and/or a dual frequency band. For Multi-band Doherty application, multiple offset lines are required.

According to an embodiment, a first offset line 217-1 in parallel with a second offset line 217-2 provides connectivity between the main amplifier 110 and the tunable impedance inverter 220. For instance, one of the first offset line 217-1 and the second offset line 217-2 is selected to provide connectivity between the output of the main amplifier 110 and the tunable impedance inverter 220. The first offset line 217-1 has a length tuned for a first frequency band, while the second offset line 217-2 is tuned for a second frequency band. The first frequency band may be different from the second frequency band. Similarly, a third offset line 217-3 in parallel with a fourth offset line 217-4 provides connectivity between the peak amplifier 115 and the tunable impedance inverter 220. For instance, one of the third offset line 217-3 and the fourth offset line 217-4 is selected to provide connectivity between the output of the peak amplifier 115 and the tunable impedance inverter 220. The third offset line 217-3 has a length tuned for the first frequency band, while the fourth offset line 217-4 is tuned for the second frequency band, or vice versa.

In another embodiment, the first offset line 217-1 is tuned for one portion of the frequency broadband (e.g., higher portion), and the second offset line 217-2 is tuned for another portion of the frequency broadband (e.g., a lower portion). The third offset line 217-3 is tuned for one portion of the frequency bandwidth, which is the same tuned bandwidth for either the first offset line 217-1 or the second offset line 217-2, and the fourth offset line 217-4 is tuned for another portion of the frequency bandwidth, which is the same tuned bandwidth for the other offset line different from the third offset line 217-3.

Figure 3:
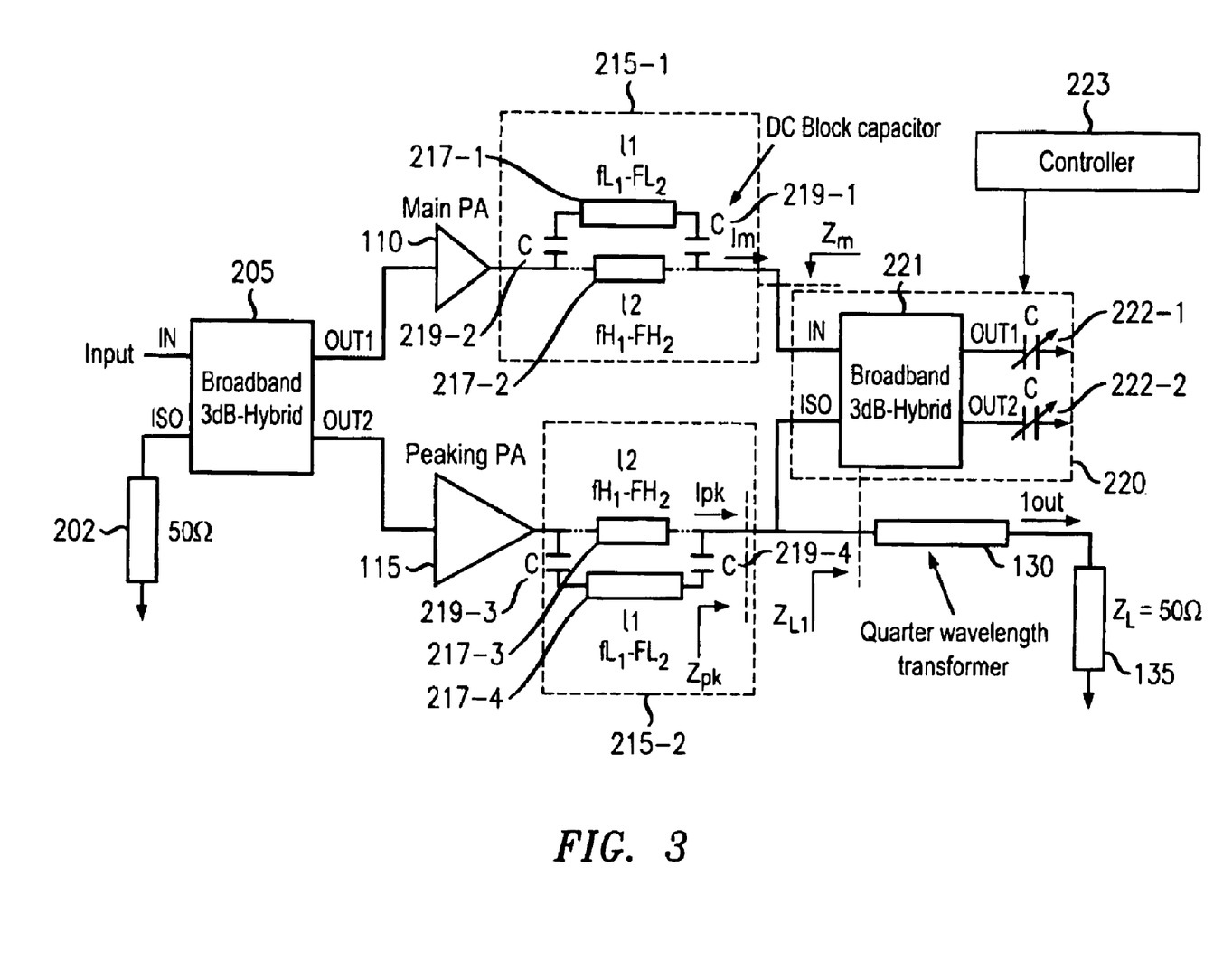
FIG. 3 illustrates a variation of the Doherty amplifier structure of FIG. 2 according to an embodiment of the present invention.

Switching between the first offset line 217-1 and the second offset line 217-2 and between the third offset line 217-3 and the fourth offset line 217-4 is performed manually by moving an output DC block capacitor or automatically by selector circuits. FIG. 2 illustrates an embodiment of automatically switching between the offset lines 217, which is described below. FIG. 3 illustrates an embodiment of manually switching between the offset lines 217, which is described later in the specification.

As shown in FIG. 2, the first offset line circuit 215-1 includes a first selector 216-1 to automatically select between the first offset line 217-1 and the second offset line 217-2. For example, the first selector 216-1 automatically selects either the first offset line 217-1 or the second offset line 217-2 to provide connectivity between the main amplifier 110 and the tunable impedance inverter 220 depending on the frequency of the input signal.

Similarly, the second offset line circuit 215-2 includes a second selector 216-2 to switch between a third offset line 217-3 and a fourth offset line 217-4. The second selector 216-2 automatically selects either the third offset line 217-3 or the fourth offset line 217-4 to provide connectivity between the peak amplifier 115 and the tunable impedance inverter 220 depending on the frequency of the input signal.

The first and the second selectors 216 may include high power switching PIN diodes having low series ON resistor (low insertion loss), and a low reverse capacitor (high isolation during the OFF state of the diode) arranged in a manner to allow switching between the first offset line 217-1 and the second offset line 217-2, or switching between the third offset line 217-3 and the fourth offset line 217-4.

FIG. 3 illustrates a variation of the Doherty amplifier structure of FIG. 2 according to an embodiment of the present application. The Doherty amplifier structure of FIG. 3 is the same as the amplifier structure of FIG. 2 except the first and second selectors 216 are removed, and DC block capacitors 219 are illustrated. For instance, one of the first offset line 217-1 and the second offset line 217-2 is selected based on manually moving the DC block capacitors 219-1 and 219-2 on the selected offset line. Also, one of the third offset line 217-3 and the fourth offset line 217-4 is selected based on manually moving the DC block capacitors 219-3 and 219-4 on the selected offset line. In other words, switching between two offset lines may be performed manually by positioning the output DC block capacitors 219 on the selected offset line.

Referring to FIG. 2 or 3, the tunable impedance inverter 220 receives signals from the first offset line circuit 215-1 and/or the second offset line circuit 215-2, and performs impedance inversion to modulate a load impedance of the main amplifier, as discussed below. The tunable impedance inverter 220 includes the hybrid coupler 221 and at least two capacitors 222 operating as a tuner to tune the impedance inversion over at least one broad frequency band. The two capacitors may be digital capacitors, fixed capacitors, or varactors as described with reference to FIG. 1. In an alternative embodiment, the tunable impedance inverter 220 may include connecting the output ports of the hybrid coupler 221 to shunt PIN Diodes with the same values in conjunction with open stubs.

By terminating two outputs of the hybrid coupler 221 by the same fixed capacitor value, the same digital capacitors, the same varactors or the same shunt PIN Diodes in conjunction with open stubs, the 90 degree phase of the hybrid coupler 221 can be ensured over the entire frequency band. In fact, terminating the two output ports of the hybrid coupler 221 by a capacitor (open circuit) reflects all the incident waves coming from the input of the hybrid coupler 221 toward its fourth isolated port which becomes its main output port. Moreover, terminating this isolated port with a 25 Ohm load (instead of 50 Ohm) double the impedance of the input port of the hybrid coupler 221, which makes the resulted circuit reacting exactly as an impedance inverter. Hence, the 2×RL (100 Ohm) termination of the Main stage is provided with a minimum insertion loss (2×IL of the coupler) when the peak amplifier 115 is OFF.

The value of the capacitors 222 sets the phase of the reflected wave at the desired frequency band which makes the resulted impedance transformer tunable over frequency. The resulted tunable impedance inverter 220 is able to operate over a multiple of frequencies. The tunable impedance inverter 220 is connected between the output side of the first offset line circuit 215-1 and a combining node 116 located between the output side of the second offset line circuit 215-2 and the quarter-wavelength transformer 130. Similar to the tunable impedance inverter 120 of FIG. 1, the hybrid coupler 221 is configured to perform impedance inversion to modulate a load impedance of the main amplifier 110.

The hybrid coupler 221 includes four ports. An input port of the hybrid coupler 221 is connected to the output side of the first offset line circuit 215-1, an isolation port is connected to the combining node 116, and a first output port is connected to a first variable capacitor 222-1, and a second output port is connected to a second capacitor 222-2. The first variable capacitor 222-1 and the second capacitor 222-2 operate as a tuner to tune the impedance inversion over a broad frequency band. As indicated above, both the first and second output ports of the hybrid coupler 221 are terminated by the same fixed capacitor value. By adjusting the values of the first and second capacitors 222, the impedance inversion is tuned over a broad frequency band. Furthermore, a controller 223 may control the adjustment of values for the first and second variable capacitors 222 in a manner similar to the controller 123 of FIG. 1. For instance, the controller 223 includes the frequency-capacitance value map as described above. The controller 223 controls the capacitance values of the first variable capacitor 222-1 and the second variable capacitor 222-2 based on the frequency-capacitance value map and the frequency of the input signal. The values of the first and second variable capacitors are typically the same with respect to each other, but vary together in order to control the impedance inversion.

Similar to FIG. 1, the output of the tunable impedance inverter 220 and the amplified second signal from the peak amplifier 115 are combined via the quarter-wavelength transformer 130, and the combination is supplied to the load impedance 135.

Figure 4:
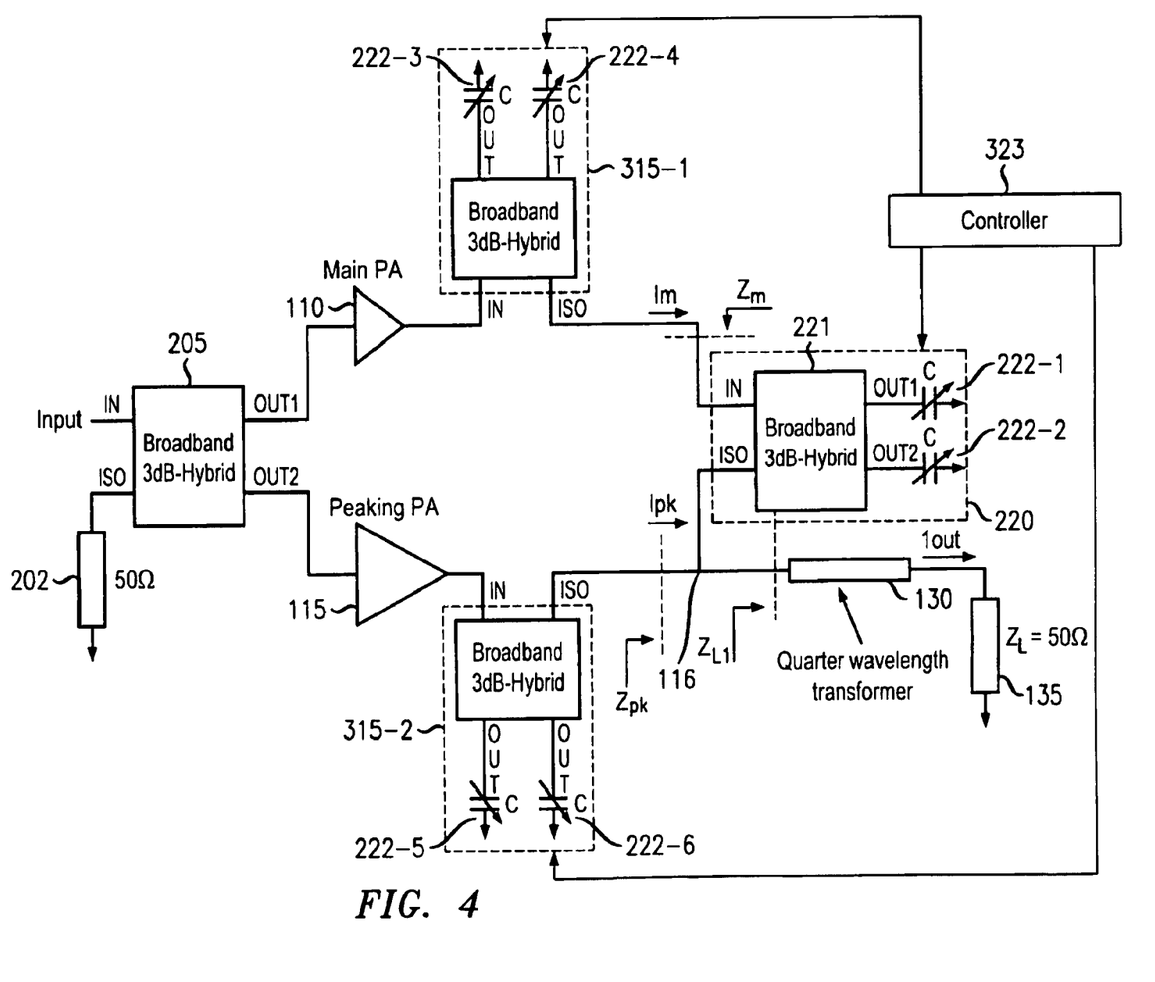
FIG. 4 illustrates a variation of the Doherty amplifier structure of FIGS. 2 and 3 according to another embodiment of the present invention.

FIG. 4 illustrates a variation of the Doherty amplifier structure of FIG. 2 according to an embodiment of the present application. The Doherty amplifier structure of FIG. 4 is the same as FIGS. 2 and 3 except a first hybrid coupler 315-1 is used in place of the first offset line circuit 215-1 and a second hybrid coupler 315-2 is used in place of the second offset line circuit 215-2.

The first hybrid coupler 315-1 includes at least four ports. An input port of the first hybrid coupler 315-1 is connected to the output of the main amplifier 110, an isolation port is connected to the input port of the tunable impedance inverter 220, and first and second output ports are terminated via a third capacitor 222-3 and a fourth capacitor 222-4. The second hybrid coupler 315-2 is similar to the first hybrid coupler 315-1. For instance, the second hybrid coupler 315-2 includes at least four ports. An isolation port of the second hybrid coupler 315-2 is connected to the output of the peak amplifier 115, an input port is connected to the node 116, and first and second output ports are terminated via a third variable capacitor 222-3 and a fourth variable capacitor 222-4.

In this embodiment, because the isolation ports of the hybrid couplers 315-1 and 315-2 are terminated with 50 Ohm impedances, the hybrid couplers 315-1 and 315-2 are not performing impedance transformation. Rather, the hybrid couplers 315-1 and 315-2 are performing a phase shifting operation. The same as for the hybrid coupler 221, the phase shift introduced is related to the capacitor values that load the 2 output ports of the two hybrid couplers 315-1 and 315-2. Hence, the hybrid couplers 315-1 and 315-2 react as tunable offset lines that will allow moving the load of the main amplifier 110 into a highest efficiency area on the 2:1 VSWR circle, while tuning a phase of the peak amplifier 115 to provide a good OPEN circuit, respectively.

Also, the capacitors 222 of the first and second hybrid couplers 315 may be controlled by the controller 323, which operates in a similar manner with respect to the controller 223 of FIG. 2. Besides controlling the values of the first and second capacitors 222 of the tunable impedance inverter 220 in a manner described above, the controller 323 also controls the capacitance values of the capacitors 222 of the first and second hybrid couplers 315. Because the rest of the components of FIG. 4 operate in a similar manner as described with reference to FIGS. 2 and 3, the details of these components are omitted for the sake of brevity.

Variations of the example embodiments of the present invention are not to be regarded as a departure from the spirit and scope of the example embodiments of the invention, and all such variations as would be apparent to one skilled in the art are intended to be included within the scope of this invention.

What is claimed is:

1. An amplifying structure, comprising:
a main amplifier configured to amplify a first signal;
a peak amplifier configured to amplify a second signal;
a tunable impedance inverter configured to perform impedance inversion to modulate a load impedance of the main amplifier, the tunable impedance inverter including a tuner configured to tune the impedance inversion over at least one broad frequency band;
a controller, including a processor, configured to control the tunable impedance inverter by adjusting values of the tuner; and
a combining node configured to receive the amplified second signal from the peak amplifier and an output of the tunable impedance inverter and combine the amplified second signal and the output of the tunable impedance inverter.

2. The amplifying structure of claim 1, further comprising:
power splitter configured to receive an input signal having the at least one frequency band and split the input signal into the first signal and the second signal.

3. The amplifying structure of claim 1, wherein the tunable impedance inverter further includes:
a circulator connected to the tuner configured to split the amplified first signal into incident signals and reflected signals, wherein the tuner adjusts a phase of the reflected signals for destructive combining at an input of the tunable impedance inverter.

4. The amplifying structure of claim 1, wherein the tuner is (i) at least one capacitor, (i) at least one varactor, or (ii) at least one open stub shunted by a diode.

5. The amplifying structure of claim 1, wherein the tunable impedance inverter includes a first hybrid coupler connected to the tuner.

6. An amplifying structure, comprising:
a main amplifier configured to amplify a first signal;
a peak amplifier configured to amplify a second signal; and
a tunable impedance inverter configured to perform impedance inversion to modulate a load impedance of the main amplifier, the tunable impedance inverter including a circulator configured to split the amplified first signal into incident signals and reflected signals and a tuner configured to adjust a phase of the reflected signals at an input of the impedance inverter;
a controller, including a processor, configured to control the tunable impedance inverter by adjusting values of the tuner; and
a combining node configured to receive the amplified second signal from the peak amplifier and an output of the tunable impedance inverter and combine the amplified second signal and the output of the tunable impedance inverter.

7. The amplifying structure of claim 6, wherein the tuner is a capacitor, varactor, or an open stub shunted by a diode.

8. The amplifying structure of claim 6, wherein the circulator includes:
a first port connected to an output terminal of the main amplifier;
a second port connected to the combining node; and
a third port connected to the tuner.

9. An amplifying structure, comprising:
a main amplifier configured to amplify a first signal;
a peak amplifier configured to amplify a second signal;
a tunable impedance inverter configured to perform impedance inversion to modulate a load impedance of the main amplifier, the tunable impedance inverter including a first hybrid coupler and a tuner, the tuner being configured to tune the impedance inversion over at least one broad frequency band;
a controller, including a processor, configured to control the tunable impedance inverter by adjusting values of the tuner; and
a combining node configured to receive the amplified second signal from the peak amplifier and an output of the first hybrid coupler and combine the amplified second signal and the output of the first hybrid coupler.

10. The amplifying structure of claim 9, wherein the tuner includes two tuning elements and each of the two tuning elements is connected to a respective output port of the first hybrid coupler.

11. The amplifying structure of claim 9, wherein the two tuning elements are (i) capacitors, (ii) varactors, or (iii) open stubs shunted by diodes.

12. The amplifying structure of claim 9, further comprising:
a first offset line and a second offset line, the first offset line and the second offset line providing connectivity between the first hybrid coupler and the main amplifier if selected, the first offset line having a length tuned for a first frequency band, the second offset line having a length tuned for a second frequency band.

13. The amplifying structure of claim 12, wherein one of the first offset line and the second offset line is selected based on manually moving a DC block capacitor of the main amplifier.

14. The amplifying structure of claim 12, further comprising:
a first selector configured to select between the first offset line and the second offset line.

15. The amplifying structure of claim 12, further comprising:
a third offset line and a fourth offset line, the third offset line and the fourth offset line providing connectivity between the first hybrid coupler and the peak amplifier if selected, the third offset line having a length tuned for the first frequency band, the fourth offset line having a length tuned for the second frequency band.

16. The amplifying structure of claim 15, wherein one of the third offset line and the fourth offset line is selected based on manually moving a DC block capacitor of the peak amplifier.

17. The amplifying structure of claim 15, further comprising:
a second selector configured to select between the third offset line and the fourth offset line.

18. The amplifying structure of claim 9, further comprising:
a second hybrid coupler connected between the main amplifier and the first hybrid coupler;
a third hybrid coupler connected between the combining node and the peak amplifier.

19. The amplifying structure of claim 18, wherein output ports of the first and second hybrid couplers are connected to tuning elements.

20. The amplifying structure of claim 19, wherein the tuning elements of the second and third hybrid couplers are (i) capacitors, (ii) varactors, or (iii) open stubs shunted by diodes.

21. A Doherty amplifier, comprising:
a tunable impedance inverter configured to tune impedance inversion to a center frequency of a signal for amplification; and
a controller, including a processor, configured to control the tunable impedance inverter.

* * * * *